United States Patent [19]

Hagino

[11] Patent Number: 5,124,592
[45] Date of Patent: Jun. 23, 1992

[54] ACTIVE FILTER

[75] Inventor: Hideyuki Hagino, Fukaya, Japan

[73] Assignee: Kabushiki Kaisha Toshiba, Kawasaki, Japan

[21] Appl. No.: 655,547

[22] Filed: Feb. 13, 1991

[30] Foreign Application Priority Data

Feb. 14, 1990 [JP] Japan .................................. 2-32699

[51] Int. Cl.$^5$ ............................................... H03K 5/00
[52] U.S. Cl. .................................... 307/520; 328/167; 330/306
[58] Field of Search ............... 307/231, 520, 521; 328/167; 330/252, 293, 306

[56] References Cited

U.S. PATENT DOCUMENTS

| | | |
|---|---|---|
| 4,292,468 | 9/1981 | Yokoyama . |
| 4,841,179 | 6/1989 | Hagino et al. .................. 307/520 |
| 4,851,718 | 7/1989 | Hagino et al. .................. 307/520 |
| 4,999,522 | 3/1991 | Deville .......................... 307/520 |

FOREIGN PATENT DOCUMENTS

| | | |
|---|---|---|
| 3830410 A1 | 3/1989 | Fed. Rep. of Germany . |
| 60-111515 | 6/1985 | Japan . |
| 61-220517 | 9/1986 | Japan . |
| 0094003 | 4/1987 | Japan .................................. 330/306 |

*Primary Examiner*—Robert J. Pascal
*Attorney, Agent, or Firm*—Banner, Birch, McKie & Beckett

[57] ABSTRACT

An input signal is supplied to the non-inverting input terminal of a current differential amplifier. A capacitor is connected between the output terminal of the current differential amplifier and a power source and the capacitor stores charges according to an output signal of the current differential amplifier. The input signal and an output signal of the current differential amplifier are supplied to resistors via buffer circuits and signals divided by the resistors are added together by a buffer circuit and output from an output terminal and at the same time fed back to the inverting input terminal of the current differential amplifier.

16 Claims, 2 Drawing Sheets

ACTIVE FILTER

BACKGROUND OF THE INVENTION

1. Field of the Invention

This invention relates to an active filter which can be used as various filters for a video signal or audio signal frequency band.

2. Description of the Related Art

An active filter is known as a filter whose size and weight can be easily reduced. The active filter is a circuit formed of a combination of an operational amplifier, resistor element and capacitor element.

FIG. 3 is an equivalent circuit diagram showing the construction of the conventional active filter. An input terminal IN is connected to the input terminal of an amplifier 31 and the non-inverting input terminal of a current differential amplifier (which is hereinafter referred to as a gm amplifier) 32. The output terminal of the amplifier 31 is connected to an output terminal of the gm amplifier 32 and an output terminal OUT via a capacitor Co. Further, the output terminal of the gm amplifier 32 is connected to the inverting input terminal of the gm amplifier 32.

FIG. 4 is a circuit diagram showing the concrete construction of the above equivalent circuit and an area surrounded by broken lines on the left hand side indicates the amplifier 31 and an area on the right hand side indicates the gm amplifier 32.

In the amplifier 31, the base of a transistor $Q_7$ is connected to the input terminal IN. The collector of the transistor $Q_7$ is connected to a power source Vcc and the emitter thereof is connected to the emitter of a transistor $Q_8$ via a resistor $R_3$ and to the ground potential Vss via a constant current source $I_4$. The emitter of the transistor $Q_8$ is connected to the ground potential Vss via a constant current source $I_5$ and the base thereof is connected to the ground potential Vss via a reference power source Vo. Further, the collector of the transistor $Q_8$ is connected to the power source Vcc via a resistor $R_4$ and to the base of a transistor $Q_9$. The collector of the transistor $Q_9$ is connected to the power source Vcc and the emitter thereof is connected to the ground potential Vss via a constant current source $I_6$.

In the gm amplifier 32, the base of a transistor $Q_1$ is connected to the input terminal IN. The collector of the transistor $Q_1$ is connected to the power source Vcc and the emitter thereof is connected to the collector and base of a transistor $Q_2$ via a resistor R1 and to the base of a transistor $Q_3$ via a resistor R1. The emitter of the transistor $Q_2$ is connected to the ground potential Vss via a constant current source $I_1$ and to the emitter of a transistor $Q_6$. The collector of the transistor $Q_3$ is connected to the power source Vcc and the emitter thereof is connected to the emitter of a transistor $Q_4$ and to the ground potential Vss via a constant current source $I_2$. The collector of the transistor $Q_4$ is connected to the emitter of the transistor $Q_9$ of the amplifier 31 via the capacitor Co and to the power source Vcc via a constant current source $I_3$. Further, the collector of the transistor $Q_4$ is connected to the base of a transistor $Q_5$ and to the output terminal OUT. The collector of the transistor $Q_5$ is connected to the power source Vcc and the emitter thereof is connected to the collector and base of the transistor $Q_6$ via a resistor $R_2$ and to the base of the transistor $Q_3$ via a resistor R2.

With the above construction, a signal voltage supplied to the input terminal IN is converted into current by means of the gm amplifier 32 and the capacitor Co is charged or discharged by the converted current. At the same time, the capacitor Co is applied with a voltage corresponding to a signal voltage supplied to the input terminal IN via the amplifier 31. As a result, a voltage obtained by adding a voltage output from the amplifier 31 to the charged voltage of the capacitor Co is output from the output terminal OUT.

That is, the signal voltage supplied from the input terminal IN is applied to the base of the NPN transistor $Q_1$ serving as the non-inverting input terminal of the gm amplifier 32 and to the base of the NPN transistor $Q_7$ serving as the input terminal of the amplifier 31. Current flowing in the collector-emitter path of the transistor $Q_1$ permits the transistor $Q_2$ to be turned on via the resistor $R_1$ and permits the transistor $Q_3$ which is one of two transistors constituting the differential pair to be turned on. Further, since the transistor $Q_5$ is always kept in the conductive state by means of the constant current source $I_3$, the transistor $Q_6$ is turned on by current flowing in the resistor $R_2$ and the transistor $Q_4$ which is the other of the two transistors constituting the differential pair is also turned on. The capacitor Co connected to the collector of the transistor $Q_4$ is charged or discharged by a current difference between the collector currents of the transistors $Q_3$ and $Q_4$ and an output signal can be derived from the output terminal OUT. Further, the output signal is fed back to the inverting input terminal of the gm amplifier 32.

In the amplifier 31, the transistor $Q_8$ is biased by the reference voltage Vo and is always kept in the on state and the transistor $Q_9$ is biased by current flowing in the resistor $R_4$ and is turned on. If a signal is input to the input terminal IN in this state, the transistor $Q_7$ is turned on. Since the resistor $R_3$ is connected between the emitters of the transistors $Q_7$ and $Q_8$, the current flowing in the transistor $Q_8$ may be varied by means of the resistor $R_3$ when the emitter current of the transistor $Q_7$ is changed according to the input signal. The operation of the transistor $Q_9$ biased by the resistor $R_4$ is controlled according to variation in the emitter current of the transistor $Q_8$. An amount of charge stored in the capacitor Co varies with variation in the emitter current of the transistor $Q_9$.

In practice, a signal which is obtained by converting a voltage into current by means of the gm amplifier 32 may affect not only the capacitor Co but also the output terminal of the amplifier 31 via the emitter resistor $r_9$ (not shown) of the transistor $Q_9$. As a result, a signal output from the output terminal OUT is deviated from a theoretical value. Further, in a case where the capacitor Co is charged according to a signal voltage supplied to the input terminal IN and the charged voltage is added to the signal obtained by converting the voltage into the current, the signal may be made unstable by the emitter resistor $r_9$ of the transistor $Q_9$ and the collector impedance Ro of the transistor $Q_4$.

In order to explain the above defects, the transfer function of the circuit having the construction shown in FIG. 4 is shown by the following equation. In this case, the emitter resistor of each transistor Qn is indicated by $r_n$ (n=7, 8, 9) and the collector impedance of the transistor $Q_4$ is indicated by Ro. Further, if the conductance of the gm amplifier is denoted by gmo, the input voltage is denoted by Vin and the output voltage is denoted by Vout, then the relation between them can be expressed by the following equation.

$$V_{out} = \frac{r_9 + (1/j\omega C_o)}{g_{mo}} (V_{in} - V_{out}) + \quad (1)$$

$$\frac{R_4}{r_7 + r_8 + R_3} \cdot \frac{R_o}{R_o + r_9 + (1/j\omega C_o)} \cdot V_{in}$$

The above equation (1) can be rewritten as follows:

$$\left(1 + \frac{1 + j\omega C_o r_9}{j\omega C_o g_{mo}}\right) V_{out} = \quad (2)$$

$$\left(\frac{1 + j\omega C_o r_9}{j\omega C_o g_{mo}} + \frac{R_4}{r_7 + r_8 + R_3} \times \frac{j\omega C_o R_o}{1 + (R_o + R_9)j\omega C_o}\right) V_{in}$$

If $1/j\omega C_o g_{mo} = n/s$, $R_4/(r_7 + r_8 + R_3) = m$, $R_9/g_{mo} = a$, and $j\omega C_o R_o/\{1 + (R_o + r_9)j\omega C_o\} = b$, then the equation (2) can be rewritten as follows:

$$\left(1 + \frac{n}{s} + a\right) V_{out} = \left(a + \frac{n}{s} + mb\right) V_{in} \quad (3)$$

In this case, the transfer function $V_{out}/V_{in}$ can be expressed as follows:

$$V_{out}/V_{in} = \frac{n + (a + mb)s}{n + (1 + a)s} \approx \frac{n + ms}{n + s} \quad (4)$$

(where $a = 0$ and $b = 1$)

As shown in the above equation (4), the signal becomes equal to the theoretical value only when $a = 0$ and $b = 1$, and this condition is satisfied when the emitter resistor $r_9$ of the transistor $Q_9$ in FIG. 4 is neglected and the collector impedance of the transistor $Q_4$ is regarded as being infinite.

As has been described, in the conventional active filter, the amplifier 31 is connected to the gm amplifier 31 by means of the capacitor Co. The amplifiers 31 and 32 inevitably interfere with each other. Consequently, the magnitude of the signal output by the active filter deviates from the theoretical value.

SUMMARY OF THE INVENTION

An object of this invention is to provide an active filter capable of deriving an output signal which is equal to the theoretical value.

The above object can be attained by an active filter comprising:

a current differential amplifier having an inverting input terminal, a non-inverting input terminal and an output terminal and supplied with an input signal at the non-inverting input terminal;

a capacitor connected between the output terminal of the current differential amplifier and a power source, for storing charges according to an output signal of the current differential amplifier; and an adding circuit for dividing the input signal and the output signal of the current differential amplifier by means of resistors and adding them together, an output signal of the adding circuit being supplied to an output terminal and to the inverting input terminal of the current differential amplifier.

According to this invention, since the capacitor is connected between the output terminal of the current differential amplifier and the ground potential and is separated from the adding circuit, the current differential amplifier and the adding circuit will not interfere with each other via the capacitor. As a result, an output signal equal to the theoretical value can be obtained.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

There will now be described an embodiment of this invention with reference to the accompanying drawings.

Figure 1:
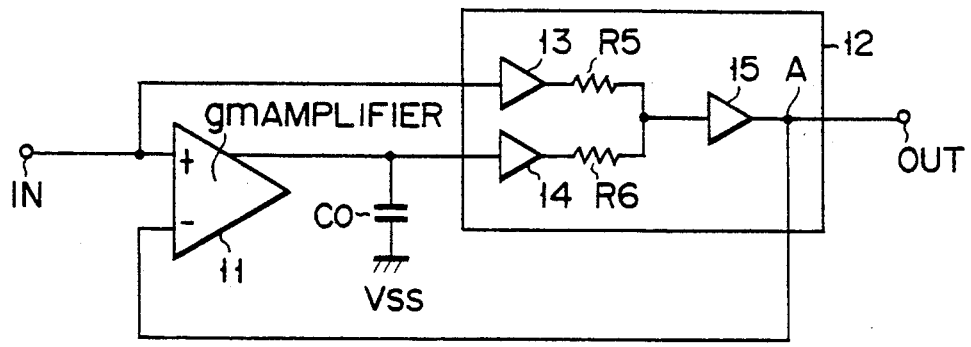
FIG. 1 is an equivalent circuit diagram of the construction according to one embodiment of this invention.

FIG. 1 is an equivalent circuit diagram showing the construction according to one embodiment of an active filter of this invention and shows a high-pass filter (HPF) or rig type high-pass filter.

An input terminal IN is connected to the non-inverting input terminal of a current differential amplifier (gm amplifier) 11 and to the input terminal of a buffer circuit 13. The output terminal of the gm amplifier 11 is connected to the ground potential Vss via a capacitor Co and to the input terminal of a buffer circuit 14. The output terminals of the buffer circuits 13 and 14 are connected to the input terminal of a buffer circuit 15 via resistors $R_5$ and $R_6$, respectively. The output terminal of the buffer circuit 15 is connected to the output terminal OUT and to the inverting input terminal of the gm amplifier 11.

Figure 2:
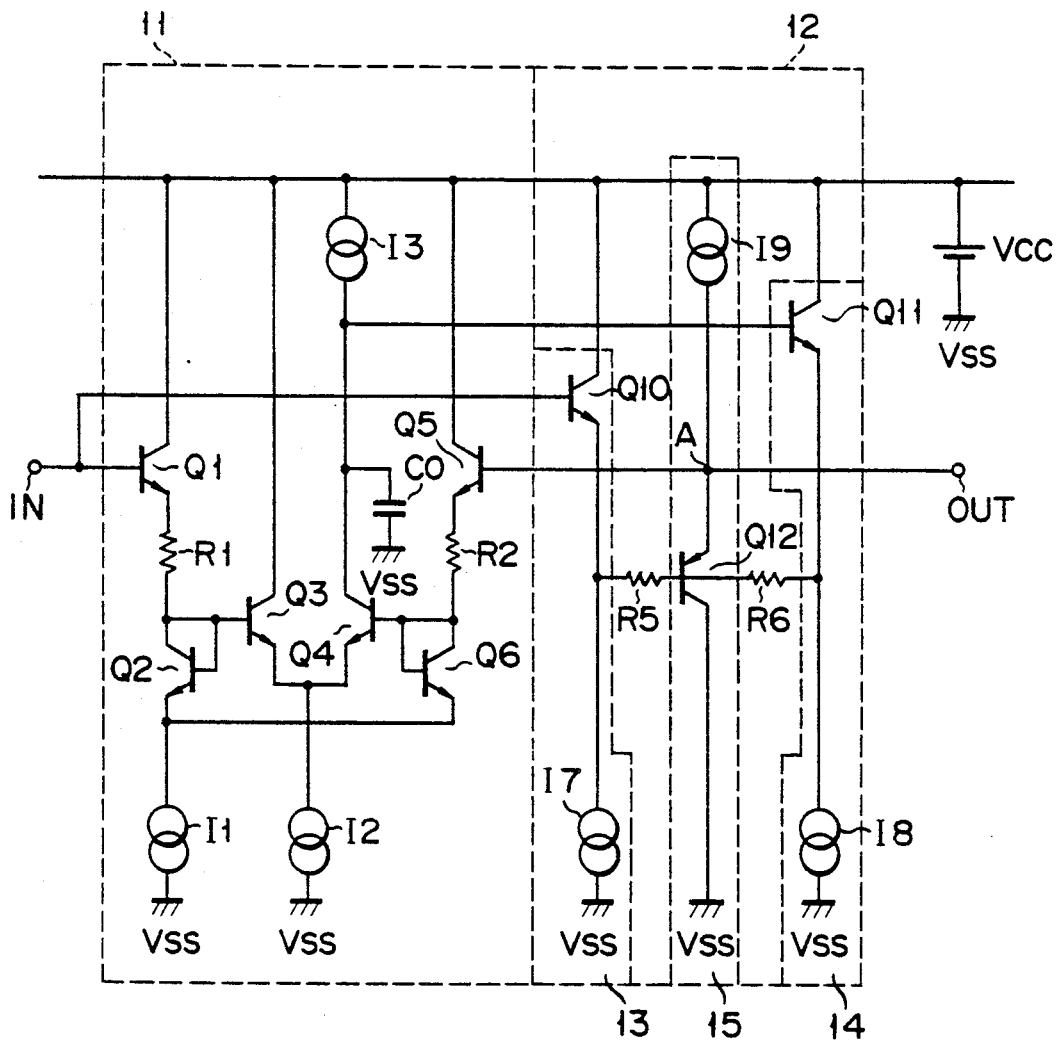
FIG. 2 is a circuit diagram showing the concrete construction of the circuit shown in FIG. 1.
Figure 3:
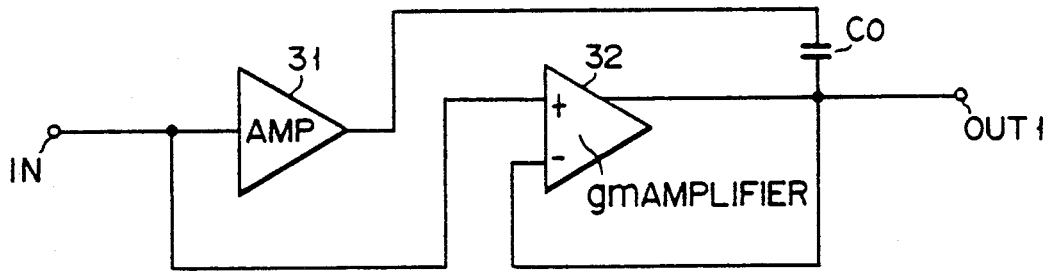
FIG. 3 is an equivalent circuit diagram showing the construction of the conventional active filter.
Figure 4:
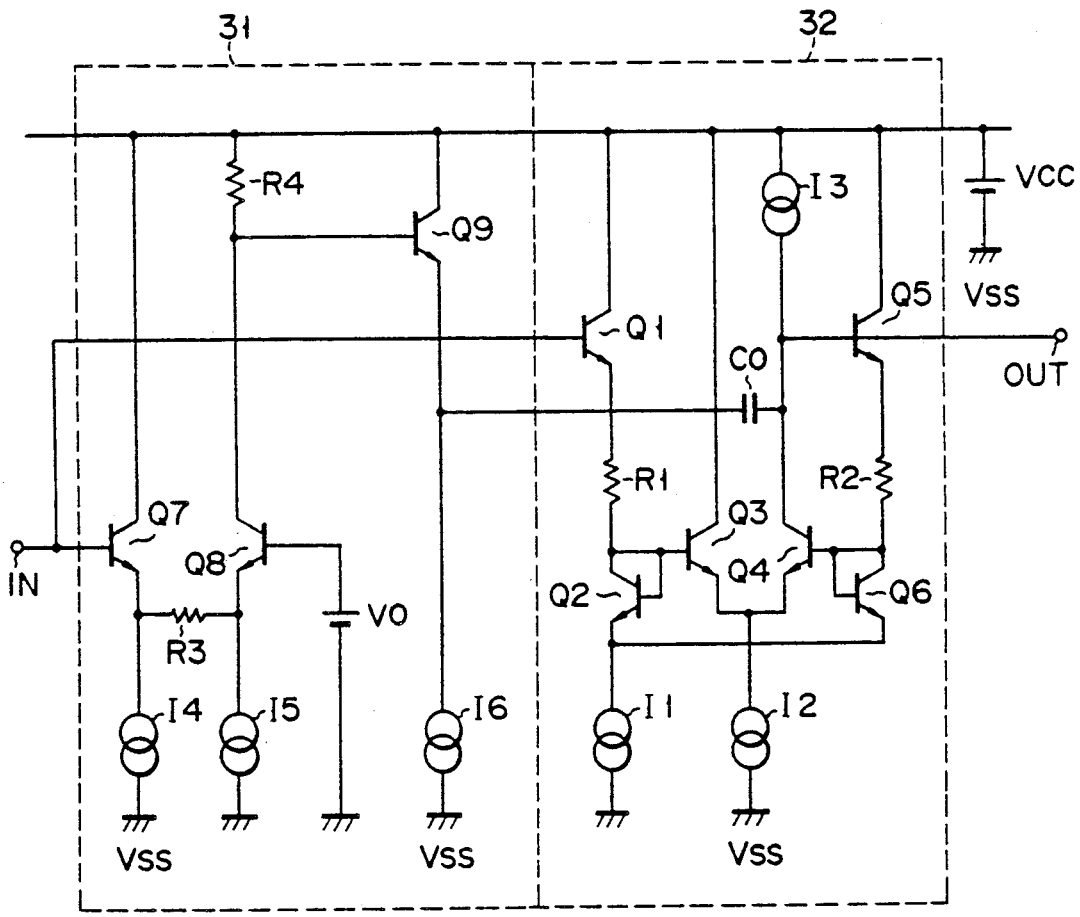
FIG. 4 is a circuit diagram showing the concrete construction of the circuit shown in FIG. 3.

FIG. 2 is a circuit diagram showing the concrete construction of the circuit shown in FIG. 1, and portions which are the same as those of FIG. 1 are denoted by the same reference numerals.

In the gm amplifier 11, the base of an NPN transistor $Q_1$ serving as the non-inverting input terminal is connected to the input terminal IN. The collector of the transistor $Q_1$ is connected to the power source Vcc, and the emitter thereof is connected to the base and collector of an NPN transistor $Q_2$ via a resistor R1 and to the base of an NPN transistor $Q_3$ via a resistor R1. The emitter of the transistor $Q_2$ is connected to the ground potential Vss via a constant current source $I_1$. The collector of the transistor $Q_3$ is connected to the power source Vcc and the emitter thereof is connected to the emitter of a transistor $Q_4$ and to the ground potential Vss via a constant current source $I_2$. The collector of the transistor $Q_4$ is connected to the ground potential Vss via the capacitor Co and to the power source Vcc via a constant current source $I_3$ and the base thereof is connected to the base and collector of a transistor $Q_6$. The emitter of the transistor $Q_6$ is connected to the emitter of the transistor $Q_2$ and the collector thereof is connected to the emitter of an NPN transistor $Q_5$ via the resistor $R_2$. The base of the transistor $Q_5$ is used as the inverting input terminal of the gm amplifier 11 and is connected to the output terminal OUT. The collector of the transistor $Q_5$ is connected to the power source Vcc.

In an adding circuit 12, the base of an NPN transistor $Q_{10}$ constituting the buffer circuit 13 is connected to the input terminal IN. The collector of the transistor $Q_{10}$ is connected to the power source Vcc and the emitter thereof is connected to the ground potential Vss via a constant current source $I_7$ and to the base of a transistor $Q_{12}$ constituting the buffer circuit 15 via the resistor $R_5$. The collector of the transistor $Q_{12}$ is connected to the ground potential Vss and the emitter thereof is connected to the output terminal OUT and to the power source Vcc via a constant current source $I_9$. Further, the base of a transistor $Q_{11}$ constituting the buffer circuit 14 is connected to the collector of the transistor $Q_4$ and the collector thereof is connected to the power source Vcc. The emitter of the transistor $Q_{11}$ is connected to the base of the transistor $Q_{12}$ via the resistor $R_6$ and to the ground potential Vss via a constant current source $I_8$.

Now, the operation of the circuit with the above construction is explained.

The base of the transistor $Q_5$ in the gm amplifier 11 is supplied with current fed back from the output terminal A of the buffer circuit 15. The current flowing in the collector-emitter path of the transistor $Q_5$ turns on the transistor $Q_6$ via the resistor $R_2$, thereby causing the transistor $Q_4$ which is one of the two transistors constituting the differential pair to be turned on.

A signal voltage supplied to the input terminal IN is applied to the base of the transistor $Q_1$ and the base of the transistor $Q_{10}$ constituting the buffer circuit 13. The current flowing in the collector-emitter path of the transistor $Q_1$ causes the transistor $Q_2$ to be turned on via the resistor $R_1$, thus causing the transistor $Q_3$ which is one of the two transistors constituting the differential pair to be turned on. As a result, charges of an amount corresponding to a difference between the collector currents of the transistors $Q_3$ and $Q_4$ are stored in the capacitor Co.

The emitter current of the transistor $Q_{10}$ which is turned on by the signal voltage supplied to the input terminal IN and the emitter current of the transistor $Q_{11}$ which is turned on by an output of the gm amplifier 11 are supplied to the base in the buffer circuit 15 via the resistors $R_5$ and $R_6$, respectively, so as to turn on the transistor $Q_{12}$. That is, a signal output from the gm amplifier 11 and a signal voltage from the input terminal IN are added together at a rate corresponding to the dividing ratio of the resistors $R_6$ and $R_5$. As a result, a signal obtained by adding a signal of a given level to the signal which is converted into the current form is output from the output terminal OUT.

According to the above embodiment, one end of the capacitor Co is grounded and it does not connect the gm amplifier 11 and adding circuit 12 to each other. Therefore, the capacitor Co will not affect the theoretical value of a signal output from the output terminal OUT and will not affect a feedback signal supplied to the inverting input terminal of the gm amplifier 11.

Next, the transfer function of the circuit in this embodiment is explained. In this case, if the load resistance in each of the transistors Qn (n=1 to 6 and 10 to 12) is denoted by $r_n$ (n=1 to 6 and 10 to 12), the conductance gm of the gm amplifier 11 is denoted by gmo, the input voltage is denoted by Vin, and the output voltage is denoted by Vout, then the relation of these factors can be expressed by the following equation.

$$Vout = \frac{1/j\omega Co}{gmo}(Vin - Vout) + \frac{1/j\omega Co}{gmo}(Vin - Vout) \cdot \tag{5}$$

$$\frac{r_{10} + R_5}{r_{10} + r_{11} + R_5 + R_6} + \frac{r_{11} + R_6}{r_{10} + r_{11} + R_5} \cdot Vin$$

In this case, if $1/j\omega Cogmo = n_1/s$ and $(r_{10}+R_5)/(r_{10}+r_{11}+R_5+R_6) = m_1$, then the equation (5) can be rewritten as follows:

$$\left(1 + \frac{n_1}{s} + \frac{n_1}{s}m_1\right)Vout = \tag{6}$$

$$\left(\frac{n_1}{s} + \frac{n_1}{s}m_1 + 1 - m_1\right)Vin$$

Further, the transfer function Vout/Vin can be expressed by the following equation:

$$Vout/Vin = \frac{n_1(1 + m_1) + (1 - m_1)s}{n_1(1 + m_1) + s} \tag{7}$$

In this case, if $1+m_1 = m$ and $n_1(1+m_1) = n$, then the equation (7) can be rewritten as follows:

$$\frac{Vout}{Vin} = \frac{n + ms}{n + s} \tag{8}$$

As shown by the equation (7), according to this embodiment, an active filter in which an output equal to the theoretical value can be derived can be obtained.

The gm amplifier, buffer circuit and the like in the circuit of the above embodiment are not limited to those shown in the above embodiment and various modifications can be made.

Further, in the above embodiment, the capacitor Co is connected between the collector of the transistor $Q_4$ and the ground potential Vss, but it can be connected between the collectors of the transistors $Q_3$ and $Q_4$, for example, so as to attain the same effect of the above embodiment.

What is claimed is:

1. An active filter comprising:
   a current differential amplifier having an inverting input terminal, a non-inverting input terminal and an output terminal and supplied with an input signal at the non-inverting input terminal;
   a capacitor connected between the output terminal of said current differential amplifier and a power source, for storing charges according to an output signal of said current differential amplifier; and
   an adding circuit for adding the input signal and the output signal of said current differential amplifier, the input signal and the output signal being divided by means of resistors, and an output signal of said adding circuit being supplied to an output terminal and to the inverting input terminal of said current differential amplifier.

2. An active filter according to claim 1, wherein said adding circuit comprises:

a first buffer circuit having an input terminal connected to the non-inverting input terminal of said current differential amplifier;

a first resistor connected at one end to an output terminal of said first buffer circuit;

a second buffer circuit having an input terminal connected to the output terminal of said current differential amplifier;

a second resistor connected at one end to an output terminal of said second buffer circuit; and a third buffer circuit having an input terminal connected to the other ends of said first and second resistors and an output terminal connected to the output terminal and to the inverting input terminal of said current differential amplifier.

3. An active filter according to claim 1, wherein said power source is a ground potential.

4. An active filter comprising:

a filter input terminal supplied with an input signal;

a current differential amplifier having an inverting input terminal, a non-inverting input terminal and an output terminal and the non-inverting input terminal being connected to said filter input terminal;

a capacitor connected between the output terminal of said current differential amplifier and a first power source potential, for storing changes according to an output signal of said current differential amplifier;

a first buffer circuit having an input terminal connected to said filter input terminal;

a first resistor connected at one end to an output terminal of said first buffer circuit;

a second buffer circuit having an input terminal connected to the output terminal of said current differential amplifier;

a second resistor connected at one end to an output terminal of said second buffer circuit;

a third buffer circuit having an input terminal connected to the other ends of said first and second resistors and an output terminal connected to the inverting input terminal of said current differential amplifier; and a filter output terminal connected to the output terminal of said third buffer circuit.

5. An active filter according to claim 4, wherein said first power source potential is a ground potential.

6. An active filter according to claim 4, wherein said current differential amplifier comprises:

a first transistor having a base, collector and emitter, the base of said first transistor being connected to said filter input terminal and the collector thereof being connected to a second power source potential;

a third resistor connected at one end to the emitter of said first transistor;

a second transistor having a base, collector and emitter, the collector and base of said second transistor being connected to the other end of said third resistor;

a first constant current source connected between the emitter of said second transistor and the first power source potential;

a third transistor having a base, collector and emitter, the base of said third transistor being connected to the other end of said first resistor and the collector thereof being connected to the second power source potential;

a fourth transistor having a base, collector and emitter, the emitter of said fourth transistor being connected to the emitter of said third transistor;

a second constant current source connected between the emitter of said fourth transistor and the first power source potential;

a third constant current source connected between the collector of said fourth transistor and the second power source potential;

a fifth transistor having a base, collector and emitter, the base and collector of said fifth transistor being connected to the base of said fourth transistor and the emitter thereof being connected to the emitter of said second transistor;

a fourth resistor connected at one end to the collector of said fifth transistor; and a sixth transistor having a base, collector and emitter, the emitter of said sixth transistor being connected to the other end of said fourth resistor, the base thereof being connected to said filter output terminal, and the collector thereof being connected to the second power source potential;

wherein said capacitor is connected between the collector of said fourth transistor and the first power source potential and an output terminal of said current differential amplifier is a connection node between the collector of said fourth transistor and said third constant current source.

7. An active filter according to claim 4, wherein said first buffer circuit comprises:

a transistor having a base, collector and emitter, the base of said transistor being connected to said filter input terminal and the collector thereof being connected to the second power source potential; and a constant current source connected between the emitter of said transistor and the first power source potential.

8. An active filter according to claim 4, wherein said second buffer circuit comprises:

a transistor having a base, collector and emitter, the base of said transistor being connected to the output terminal of said current differential amplifier and the collector thereof being connected to the second power source potential; and a constant current source connected between the emitter of said transistor and the first power source potential.

9. An active filter according to claim 4, wherein said third buffer circuit comprises:

a transistor having a base, collector and emitter, the base of said transistor being connected to the other ends of said first and second resistors and the collector thereof being connected to the first power source potential; and a constant current source connected between the emitter of said transistor and the second power source potential.

10. An active filter comprising:

a filter input terminal for receiving an input signal;

a current differential amplifier having inverting input terminal, a non-inverting input terminal coupled to said filter input terminal, and an output terminal for outputting a differential amplifier output signal; and an adding circuit for adding the input signal and the differential amplifier output signal, said adding circuit having input terminals for receiving the input signal and the differential amplifier output signal and an output terminal for outputting an adding circuit output signal, the inverting input of said current differential amplifier coupled to the output terminal of said adding circuit; and a filter output terminal coupled to the output terminal of said adding circuit.

11. The active filter according to claim 10 further comprising:

a capacitor coupled between the output terminal of said current differential amplifier and a first power source potential for storing a charge corresponding to the differential amplifier output signal.

12. The active filter according to claim 10, wherein said adding circuit comprises:

a first buffer circuit having an input terminal coupled to receive the input signal;

a first resistor having a first terminal coupled to an output terminal of said first buffer circuit;

a second buffer circuit having an input terminal connected to the output terminal of said current differential amplifier;

a second resistor having a first terminal coupled to an output terminal of said second buffer circuit; and a third buffer circuit having an input terminal connected to second terminals of said first and second resistors and an output terminal for outputting the adding circuit output signal.

13. The active filter according to claim 12, wherein said first buffer circuit comprises:

a transistor having a base coupled to said filter input terminal, a collector coupled to the second power source potential, and an emitter; and a constant current source coupled between the emitter of said transistor and the first power source potential.

14. The active filter according to claim 12, wherein said second buffer circuit comprises:

a transistor having a base coupled to the output terminal of said current differential amplifier, a collector coupled to the second power source potential and an emitter; and a constant current source coupled between the emitter of said transistor and the first power source potential.

15. The active filter according to claim 12, wherein said third buffer circuit comprises:

a transistor having a base coupled to the second terminals of said first and second resistors, a collector coupled to the first power source potential, and an emitter; and a constant current source coupled between the emitter of said transistor and the second power source potential.

16. The active filter according to claim 10, wherein said current differential amplifier comprises:

a first transistor having a base, collector, and emitter, the base coupled to receive the input signal and the collector coupled to a second power source potential;

a first resistor having a first terminal coupled to the emitter of said first transistor;

a second transistor having a base, collector, and emitter, the base and collector coupled to the second terminal of said first resistor;

a first constant current source coupled between the emitter of said second transistor and the first power source potential;

a third transistor having a base, collector, and emitter, the base coupled to the second terminal of said first resistor and the collector coupled to the first power source potential, and an emitter;

a fourth transistor having a base, collector, and emitter, the emitter coupled to the emitter of said third transistor;

a second constant current source coupled between the coupled emitters of said third and fourth transistors and the first power source potential;

a third constant current source coupled between the collector of said fourth transistor and the second source potential;

a fifth transistor having a base, collector, and emitter, the base and the collector coupled to the base of said fourth transistor and the emitter coupled to the emitter of said second transistor;

a fourth resistor having a first terminal coupled to the collector of said fifth transistor; and a sixth transistor having a base, collector, and emitter, the emitter coupled to a second terminal of said fourth resistor, the collector coupled to the second power source potential, and the base for outputting the differential amplifier output signal.

* * * * *